United States Patent [19]

Matsubara et al.

[11] Patent Number: 5,242,896
[45] Date of Patent: Sep. 7, 1993

[54] SUPERCONDUCTOR CRYSTAL AND PROCESS FOR PREPARING THE SAME

[75] Inventors: Ichiro Matsubara, Ikeda; Hideo Tanigawa, Kawanishi; Toru Ogura, Toyonaka; Hiroshi Yamashita, Kawanishi; Makoto Kinoshita, Ikeda; Tomoji Kawai, Minoo, all of Japan

[73] Assignee: Agency for Industrial Science and Technology, Tokyo, Japan

[21] Appl. No.: 777,055

[22] Filed: Oct. 16, 1991

Related U.S. Application Data

[62] Division of Ser. No. 655,695, Feb. 15, 1991.

[30] Foreign Application Priority Data

Mar. 7, 1990 [JP] Japan .................. 2-177123
Mar. 7, 1990 [JP] Japan .................. 2-177124

[51] Int. Cl.$^5$ .................. C01F 11/02; C30B 1/02
[52] U.S. Cl. .................. 505/1; 505/729; 156/600; 156/603; 156/DIG. 112
[58] Field of Search .......... 156/600, 603, DIG. 112; 505/1, 729

[56] References Cited

U.S. PATENT DOCUMENTS

5,057,486 10/1991 Arendt et al. .................. 505/1
5,057,488 10/1991 Arendt et al. .................. 505/1

FOREIGN PATENT DOCUMENTS

2-275799 11/1990 Japan .................. 505/729

OTHER PUBLICATIONS

Zhanchun et al., "High Fe Superconductivity in Single Crystal of Bi-Ca-Sr-Cu-O" Solid State Communications vol. 67, No. 2, pp. 101-103, 1988.
Matsubara et al. "Preparation and Critical Density of Bismuth Strontium Calcium Copper Oxide ($Bi_2Sr_2Ca_2Cu_3O_{10\pm x}$)..." Appl. Phys. Lett. 57(23) 1990, 2490-1, abstract only.

*Primary Examiner*—Robert Kunemund
*Attorney, Agent, or Firm*—Armstrong, Westerman, Hattori, McLeland & Naughton

[57] ABSTRACT

A process for producing a fibrous crystal or single crystal of a superconductor comprising bismuth, strontium, calcium, copper, lead and oxygen, having an atomic composition ratio represented by the formula $Bi_{2-x}Pb_xSr_{1.9-2.1}Ca_{1.9-2.1}Cu_3O_y$ wherein $0 < X < 0.4$ and $10.0 < y < 11.0$, and having a $Bi_2Sr_2Ca_2Cu_3O_{10}$ structure (2223 structure).

2 Claims, 3 Drawing Sheets

SUPERCONDUCTOR CRYSTAL AND PROCESS FOR PREPARING THE SAME

This is a division of application Ser. No. 655,695 filed Feb. 15, 1991; now pending.

BACKGROUND OF THE INVENTION

The present invention relates to a superconducting crystal and a process for preparing the same.

Since the discovery of a high-temperature oxide superconductor in recent years, the research and development of a superconductor for practical use have actively been conducted in various application fields.

For example, a technique for forming a thin film of a superconducting oxide material is necessary for devices and elemental devices of computers and the like where use is made of superconducting quantum interference devices (SQUID) or Josephson devices. It has been reported in this relation that it is possible to prepare, through sputtering, vapor deposition, CVD, etc., a thin film of a single crystal free from grain boundary and having characteristics capable of sufficiently rendering the superconductor practicable, i.e., a critical current density exceeding about $10^6$ A/cm$^2$.

Meanwhile, in order to take advantage of the characteristics of an oxide superconductor in power storage, power transportation, generation of a strong magnetic field, etc., it is necessary to fabricate wires therefrom. For this purpose, attempts have been made on, for example, a method wherein a calcined powder of an oxide superconductor is packed in a silver sheath and then again heat-treated, a sol-gel method, a method wherein a powder of an oxide superconductor is suspended in a polymer solution and wires are drawn from the suspension, and a method wherein wires are drawn from a molten oxide superconductor.

Each of the wires prepared by the above-described methods is a polycrystalline substance and has a low density and a grain boundary, so that no wire having characteristics on a practical level has been prepared as yet. Further, the above-described wires have drawbacks inherent in the polycrystalline, substance such as brittleness, poor fabricability, low bending strength, etc.

It has been reported that certain oxide super-conductors have each a critical temperature above the liquid nitrogen temperature, which has a significant meaning in connection with a cooling cost. Examples of the oxide superconductor having a critical temperature above the liquid nitrogen temperature include those based on bismuth, yttrium and thalium.

For the Bi-based oxide, there are three types of structures, i.e., $Bi_2Sr_2Cu_1O_6$ structure (2201 structure), $Bi_2Sr_2CaCu_2O_8$ structure (2212 structure) and $Bi_2Sr_2Ca_2Cu_3O_{10}$ structure (2223 structure) respectively called the 20K structure, 80K structure and 110K structure according to their critical temperatures. In particular, the 2223 structure having the highest critical temperature has been regarded as a material best suited for practical use from the viewpoint of a possible wide margin between the critical temperature and the liquid nitrogen temperature. In fact, however, it is difficult to obtain a single phase of the 2223 structure, and the 2223 structure tends to form a mixed phase with the 2212 or 2201 structure.

According to the solid reaction, a single phase of the 2223 structure can be obtained under strict control of the composition and heating atmosphere. The resultant product, however, is a powdery or polycrystalline sinter and has a low density and many grain boundaries.

Therefore, as with the 2201 and 2212 structures wherein a large single crystal, single-crystal fibrous crystal, etc. have already been obtained, the formation of a large single crystal, single-crystal fibrous crystal, etc., of the 2223 structure would be very useful from the viewpoint of practical use.

In view of the above-described state of the art, the present inventors have made various studies and, as a result, have found that the heat treatment of a fibrous crystal or a single crystal having a $Bi_2Sr_2Cu_1O_6$ structure or a $Bi_2Sr_2Ca_1Cu_2O_8$ structure in an oxide powder having a particular composition containing bismuth, strontium, calcium, copper and lead under particular conditions causes the crystal structure to be converted into a $Bi_2Sr_2Ca_2Cu_3O_{10}$ structure (2223 structure) while maintaining the original outline of fibrous crystal or the original outline of single crystal, and raises the critical temperature above the liquid oxygen temperature, which has led to the completion of the present invention.

SUMMARY OF THE INVENTION

A first object of the present invention is to provide a superconducting crystal having a $Bi_2Sr_2Ca_2Cu_3O_{10}$ structure (2223 structure) and consisting of a single phase of a fibrous crystal or a single crystal alone, and a process for preparing the same.

A second object of the present invention is to provide a superconducting crystal having a critical temperature exceeding 100K, and a process for preparing the same.

The superconducting crystal which can attain the above-described objects of the present invention comprises bismuth, strontium, calcium, copper, lead and oxygen, has an atomic composition ratio represented by the formula $Bi_{2-x}Pb_xSr_{1.9-2.1}Ca_{1.9-2.1}Cu_3O_y$ wherein $0 < X < 0.4$ and $10.0 < y < 11.0$, has only a $Bi_2Sr_2Ca_2Cu_3O_{10}$ structure (2223 structure) and comprises a fibrous crystal or a single crystal.

The above-described superconducting crystal can be prepared by embedding a starting crystal selected from the group consisting of a fibrous crystal comprising bismuth, strontium, calcium, copper and oxygen and having a $Bi_2Sr_2Ca_1Cu_2O_8$ structure (2212 structure), a fibrous crystal comprising bismuth, strontium, copper and oxygen and having a $Bi_2Sr_2CuO_6$ structure (2201 structure) a single crystal comprising bismuth, strontium, calcium, copper and oxygen and having a $Bi_2Sr_2CaCu_2O_8$ structure (2212 structure), and a single crystal comprising bismuth, strontium, copper and oxygen and having a $Bi_2Sr_2Cu_1O_6$ structure (2201 structure), in an oxide powder having the following atomic composition ratio:

Bi = 1.0,
Sr = 0.5 to 1.5,
Ca = 1.0 to 3.0,
Cu = 1.0 to 5.0, and
Pb = 0.2 to 1.0, and heat-treating the embedded starting crystal at 830° to 860° C.

DESCRIPTION OF THE PREFERRED EMBODIMENTS

Figure 1:
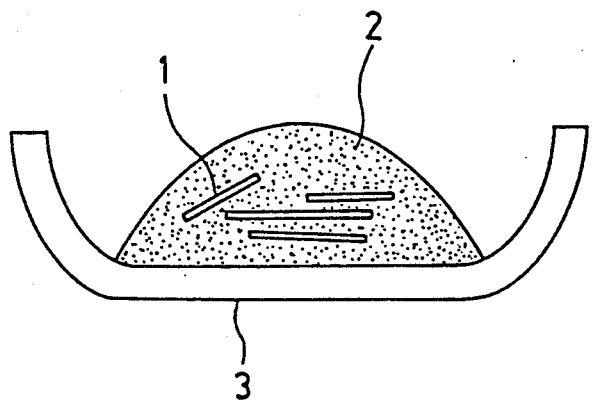
FIG. 1 is a schematic cross-sectional view of an outline of a heat treatment of a fibrous crystal as a starting material in the present invention.

The superconducting crystal of the present invention consists of a single phase of a fibrous crystal or a single crystal alone, comprises bismuth, strontium, calcium, copper, lead and oxygen, has an atomic composition ratio represented by the formula $Bi_{2-x}Pb_xSr_{1.9-2.1}Ca_{1.9-2.1}Cu_3O_y$ wherein $0 < x < 0.4$ and $10.0 < y < 11.0$, and has a $Bi_2Sr_2Ca_2Cu_3O_{10}$ structure (2223 structure).

The above-described superconducting crystal of the present invention can be prepared by embedding a starting crystal selected from the group consisting of (A) a fibrous crystal comprising bismuth, strontium, calcium, copper and oxygen and having a $Bi_2Sr_2Ca_1Cu_2O_8$ structure (2212 structure), (B) a fibrous crystal comprising bismuth, strontium, copper and oxygen and having a $Bi_2Sr_2CuO_6$ structure (2201 structure), (C) a single crystal comprising bismuth, strontium, calcium, copper and oxygen and having a $Bi_2Sr_2CaCu_2O_8$ structure (2212 structure), and (D) a single crystal comprising bismuth, strontium, copper and oxygen and having a $Bi_2Sr_2Cu_1O_6$ structure (2201 structure), in an oxide power having the following atomic composition ratio:

Bi = 1.0,
Sr = 0.5 to 1.5,
Ca = 1.0 to 3.0,
Cu = 1.0 to 5.0, and
Pb = 0.2 to 1.0, and heat-treating the embedded starting crystal at 830° to 860° C.

In the above-described starting crystals (A), (B), (C) and (D), the bismuth site of the 2212 and 2201 structures may be partly replaced with lead.

All the above-described crystals (A), (B), (C) and (D) are known in the art. For example, according to a proposal made by the present inventors, a fibrous crystal (A) having a $Bi_2Sr_2Ca_1Cu_2O_8$ structure (2212 structure) can be prepared by quenching a melt to prepare a glassy material and annealing the glassy material in an oxygen gas stream at a temperature of 830° to 870° C. for about 100 hr (see Japanese Journal of Applied Physics, 28 (1989), L1121).

The fibrous crystal (B) having a $Bi_2Sr_2Cu_1O_6$ structure (2201 structure) is disclosed by the present inventors on page 443 of the Proceedings of Annual Meeting (1990) of the Japanese Ceramic Society and can be prepared by quenching a metal to prepare a glassy material and annealing the glassy material in an oxygen gas stream at 810° to 820° C. for about 100 hr.

Similarly, the single crystal (C) comprising bismuth, strontium, calcium, copper and oxygen and having a $Bi_2Sr_2Ca_1Cu_2O_8$ structure (2212 structure) and the single crystal (D) comprising bismuth, strontium, copper and oxygen and having a $Bi_2Sr_2CuO_6$ structure (2201 structure) can be prepared by maintaining a starting mixture having a composition ratio of Bi:Sr:Ca:Cu of 2:1:1:2 (in the case of a $Bi_2Sr_2CaCu_2O_8$ single crystal) and a starting mixture having a composition ratio of Bi:Sr:Cu of 2:1:1 (in the case of a $Bi_2Sr_2CuO_6$ single crystal) at 1000° C. for 10 hr and gradually cooling the mixture at a cooling rate of 5° C./hr (see S. Kishida et al., J. Cryst. Growth, 99, 937 (1990)).

In preparing the superconducting crystal of the present invention, an oxide power (hereinafter often referred to as "embedding powder") is first prepared. This oxide powder can be prepared by mixing starting materials for an oxide so as to have the following atomic composition ratio Bi=1.00, Sr=0.5 to 1.5, Ca=1.0 to 3.0, Cu=1.0 to 5.0, and Pb=0.2 to 1.0, and heating the mixture at 800° to 860° C. The heating yields an oxide powder (an embedding powder) comprising a $Bi_2Sr_2CaCu_2O_8$ structure, a $Bi_2Sr_2CuO_6$ structure and composite oxides and oxide mixtures such as $Ca_2PbO_4$, $(Ca,Sr)_3Cu_5O_x$ and CuO.

There is no particular limitation on the starting materials for an oxide as far as they can form an oxide by firing, and metals in the form of a simple substance, an oxide and various compounds (such as carbonate) may be used. Compounds containing two or more of the above-described atoms may be used as the starting material for an oxide.

When the melting is conducted in an oxygen atmosphere such as air or the starting materials for an oxide per se contain a sufficient amount of oxygen, there is no need of using a starting material as an oxygen source. The heating temperature and time vary depending upon factors such as the kind and composition ratio of the starting materials used. In general, however, the heating temperature and time are about 800° to 860° C. and about 5 to 100 hr, respectively, and, for example, about 840° C. and about 20 hr, respectively. There is no particular limitation on the heating means as well, and any of an electric heating oven, a gas heating oven, etc., may be used. Then, the heated product is sufficiently pulverized and powdered to prepare an oxide powder. Subsequently, the above-described fibrous crystal (A) or (B) or single crystal (C) or (D) as the starting crystal is embedded in the oxide powder thus prepared and heat-treated.

The heat-treating temperature and time vary depending upon the composition ratio of the embedding powder to be used and the size of the fibrous crystal to be heat-treated. However, the heat-treating temperature and time are usually about 830° to 860° C. and 50 to 200 hr, respectively, and, for example, about 840° C. and about 120 hr, respectively.

There is no particular limitation on the heat-treating means as well, and any of an electric heating oven, a gas heating oven, etc., may be used.

After the completion of the heat treatment, the heated product is removed from the embedding powder to obtain a superconducting crystal having a composition ratio represented by the formula $Bi_{2-x}Pb_xSr_{1.9-2.1}Ca_{1.9-2.1}Cu_3O_y$ wherein $0 < x < 0.4$ and $10.0 < y < 11.0$, and having a $Bi_2Sr_2Ca_2Cu_3O_{10}$ structure (2223 structure). When the starting crystal (A) or (B) is embedded, the above-described fibrous crystal of a superconductor having a 2223 structure is obtained. When the starting crystal (C) or (D) is embedded, a single crystal of a superconductor having a 2223 structure is similarly obtained.

The length, size, form, etc., of the resultant fibrous crystal or single crystal are the same as those before the heat treatment. In the process for preparing a superconducting crystal according to the present invention, it is necessary to meet the following requirements (a) to (b).

(a): An embedding powder having a ratio of components falling within a particular range should be used. If the proportion of even one of the components of the oxide powder used for embedding is outside the specified range, it becomes difficult or impossible to convert the starting fibrous crystal or single crystal into a 2223 structure.

(b): The heat treatment should be conducted in a particular temperature range. Even if the composition of the fibrous crystal or single crystal as a starting material and the composition of the embedding powder fall within respective specified ranges, it becomes difficult or impossible to convert the starting fibrous crystal or single crystal into a 2223 structure when the heat-treating temperature is outside the specified range.

In the process according to the present invention, although the mechanism through which the fibrous crystal or single crystal having a 2201 structure or the fibrous crystal or single crystal having a 2212 structure is converted into one having a 2223 structure has not yet been elucidated, it is believed to be as follows. In order to convert the fibrous crystal or single crystal having a 2201 structure or the fibrous crystal or single crystal having a 2212 structure into one having a 2223 structure, it is necessary to supply calcium and copper (and further lead in the case where the above-described fibrous or single crystal is free from lead). In the process of the present invention, the temperature of the heat treatment of the fibrous crystal or single crystal in the oxide powder used for embedding (830° to 860° C.) correponds to the partial melting temperature of the oxide powder.

When the heat treating temperature is excessively high, the proportion of the liquid phase portion of the oxide powder becomes large. This causes the fibrous crystal or single crystal to be fused with the oxide powder, so that it becomes difficult to separate and remove the fibrous crystal or single crystal from the oxide powder. On the other hand, when the heat-treating temperature is below the partial melting temperature of the oxide powder, no interaction occurs between the fibrous crystal or single crystal and the oxide powder, so that the conversion of the structure into a 2223 structure cannot be accomplished. However, when the heat treatment is conducted in the above-described temperature range, there exists a suitable proportion of a liquid phase in the vicinity of the fibrous crystal or single crystal. It is believed that calcium and copper are supplied from the embedding oxide powder to the fibrous crystal or single crystal through the liquid phase, thereby causing the crystal structure to be converted into a 2223 structure.

As described above, the present invention provides a fibrous crystal or single crystal of a superconductor which has a composition represented by the foumula $Bi_{2-x}Pb_xSr_{1.9-2.1}Ca_{1.9-2.1}Cu_3O_y$ wherein $0 < x < 0.4$ and $10.0 < y < 11.0$ and a structure represented by the formula $Bi_2Sr_2Ca_2Cu_3O_{10}$ (2223 structure).

The fibrous crystal or single crystal of a superconductor according to the present invention can be used in liquid nitrogen because it has a critical temperature exceeding 100K. Further, it is advantageously bendable. Therefore, it can be expected to be utilized in extensive fields such as application to a magnet material for generation of a magnetic field and a material for fabricating wires for power storage and power transportation as a high-temperature superconducting material usable in liquid nitrogen through the fabrication of wires by means of spot welding wherein use is made of a laser beam or the like, and further a material for Josephson devices of the point contact type wherein the form of the tip is utilized.

The present invention will now be described in more detail by way of the following Examples.

EXAMPLE 1

Starting materials for an oxide were sufficiently mixed with each other so as to have atomic composition ratios specified in the following Table 1. Thereafter, 15 g of the mixture was placed in an aluminum crucible and fired in an electric oven at 840° C. for 20 hr. The resultant fired product was sufficiently pulverized to prepare an embedding oxide powder.

Then, as shown in a schematic cross-sectional view of FIG. 1, 50 pieces of a previously prepared fibrous crystal (1) having a $Bi_2Sr_2Ca_1Cu_2O_8$ structure (2212 structure) (starting crystal) were embedded in the above-described embedding oxide powder (2) put on an alumina boat (3) and heat-treated at 840° C. for 120 hr in an electric oven.

After the completion of the heat treatment, the fibrous crystal was separated from the embedding powder.

Figure 2:
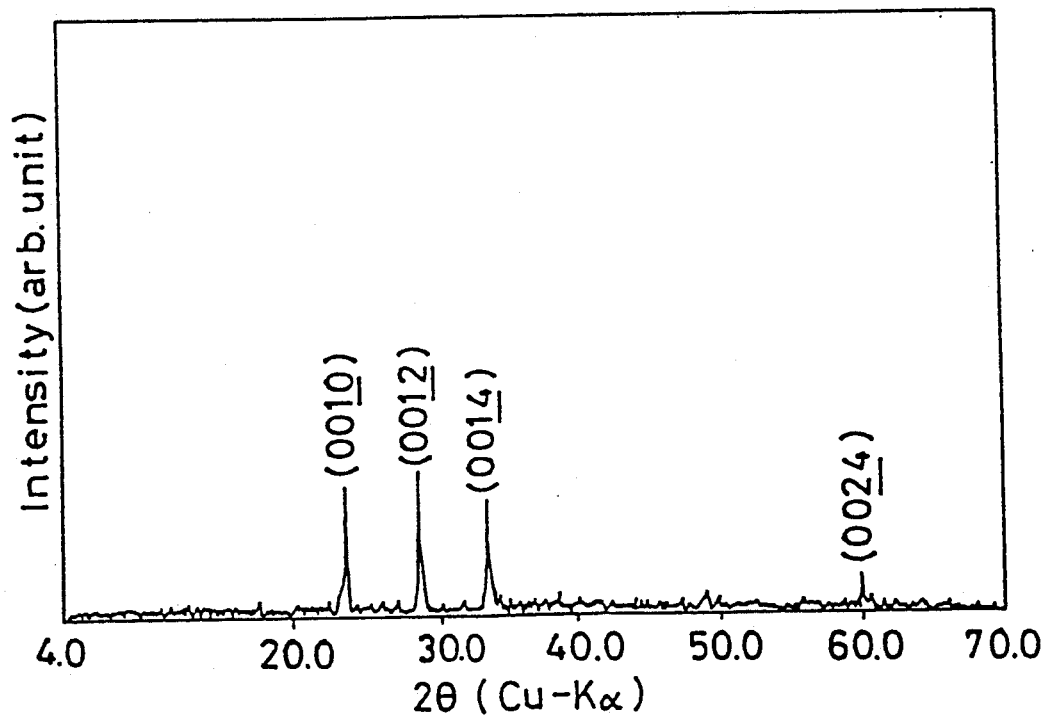
FIG. 2 is a diagram showing one example of an X-ray diffraction pattern of a fibrous crystal of the superconductor prepared according to the present invention.

An X-ray diffraction pattern of the recovered fibrous crystal is shown in FIG. 2. From this X-ray diffraction pattern, it has been confirmed that the fibrous crystal after the heat treatment has a $Bi_2Sr_2Ca_2Cu_3O_{10}$ structure (2223 structure).

Figure 3:
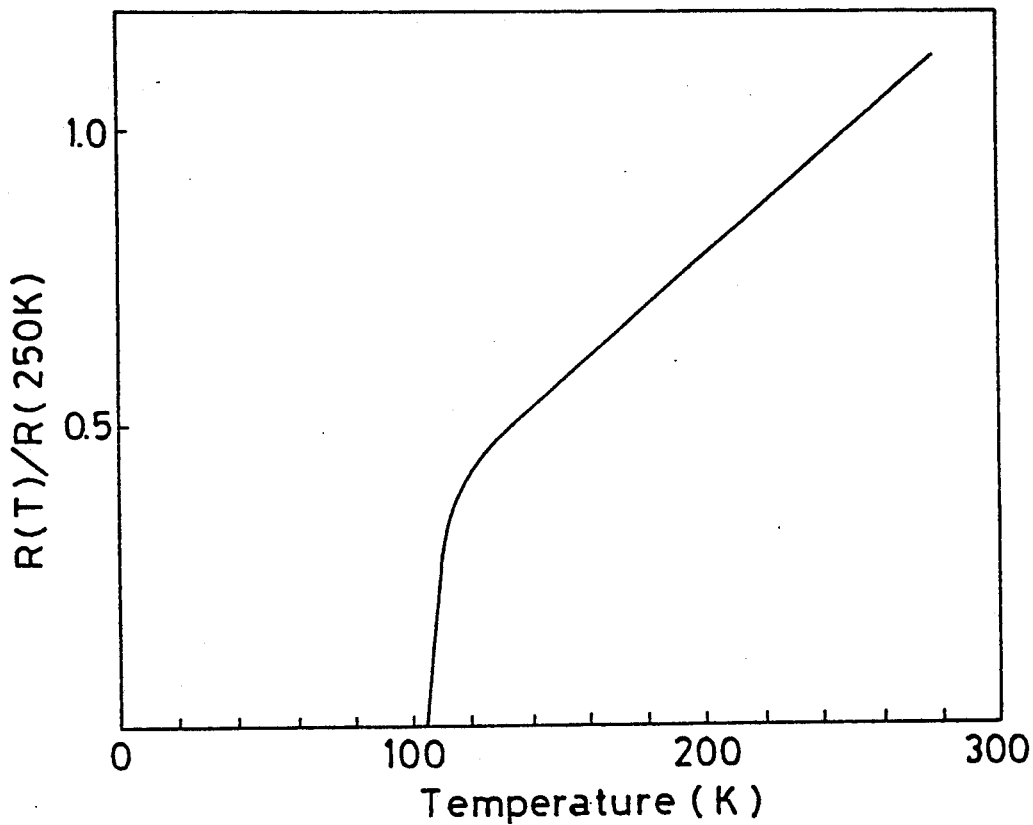
FIG. 3 is a diagram showing the relationship between the absolute temperature and the electrical resistance of a fibrous crystal of the superconductor prepared according to the present invention.

The relationship between the electrical resistance of the fibrous crystal as determined by the d.c. four-terminal method and the absolute temperature was as shown in FIG. 3. The temperature at which the electrical resistance became zero was 107K.

In the present Example and the following Examples, the starting materials used for preparing an embedding oxide powder were as follows.

| | |
|---|---|
| * Bi source | bismuth oxide |
| * Sr source | strontium carbonate ($SrCO_3$) |
| * Ca source | calcium carbonate ($CaCo_3$) |
| * Cu source | copper oxide (CuO) |
| * Pb source | lead oxide (PbO) |

EXAMPLES 2 to 6

In accordance with the procedures described in Example 1, fibrous crystals listed in Table 1 each having a 2212 structure or a 2201 structure were embedded in an oxide powder and heat-treated at a predetermined temperature for 120 hr.

It has been confirmed that each of the fibrous crystals after the heat treatment has the same crystal structure and superconductivity as those of the fibrous crystal in Example 1.

Regarding Examples 1 to 6, the structure of the fibrous crystal before the heat treatment and the composition of the oxide powder are given in Table 1, while the heat-treating temperature, the structure of the fibrous crystal after the heat treatment and the critical temperature are given in Table 2.

TABLE 1

| Ex. No. | Structure of fibrous crystal (starting crystal) before heat treatment | Composition ratio of oxide powder | | | | |
|---|---|---|---|---|---|---|
| | | Bi | Pb | Sr | Ca | Cu |
| 1 | 2212 | 1 | 0.25 | 1 | 2 | 3 |
| 2 | 2212 | 1 | 0.5 | 0.75 | 2.5 | 4 |
| 3 | 2212 | 1 | 1 | 1.5 | 3 | 5 |
| 4 | 2212 | 1 | 0.2 | 1.5 | 3 | 3 |
| 5 | 2212 | 1 | 0.2 | 0.5 | 1 | 1 |
| 6 | 2201 | 1 | 0.25 | 1 | 3 | 3 |

TABLE 2

| Ex. No. | Heat treating temperature (°C.) | Structure of fibrous crystal, after heat treatment | Critical temperature (K.) |
|---|---|---|---|
| 1 | 840 | 2223 | 107 |
| 2 | 840 | 2223 | 107 |
| 3 | 830 | 2223 | 106 |
| 4 | 850 | 2223 | 106 |
| 5 | 860 | 2223 | 106 |
| 6 | 840 | 2223 | 107 |

EXAMPLE 7

Starting materials for an oxide were sufficiently mixed with each other so as to have atomic composition ratios specified in the following Table 3. Thereafter, 15 g of the mixture was placed in an aluminum crucible and fired in an electric oven at 840° C. for 20 hr. The resultant fired product was sufficiently pulverized to prepare an embedding oxide powder.

Figure 4:
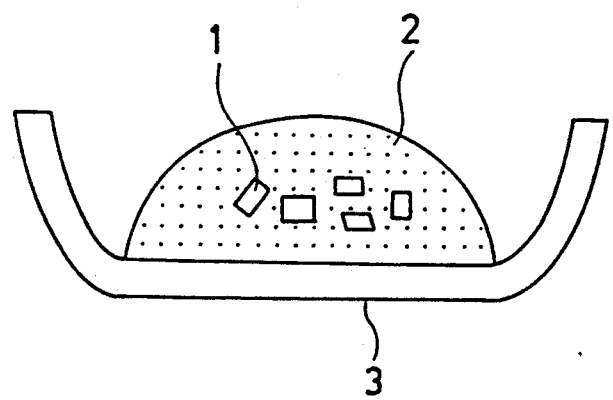
FIG. 4 is a schematic cross-sectional view of an outline of a heat treatment of a single crystal as a starting material in the present invention.

Then, as shown in a schematic cross-sectional view of FIG. 4, a previously prepared single crystal (1) having a $Bi_2Sr_2Ca_1Cu_2O_8$ structure (2212 structure) were embedded in the above-described embedding oxide powder (2) put on an alumina boat (3) and heat-treated at 840° C. for 120 hr in an electric oven. After the completion of the heat treatment, the fibrous crystal was separated from the embedding powder.

Figure 5:
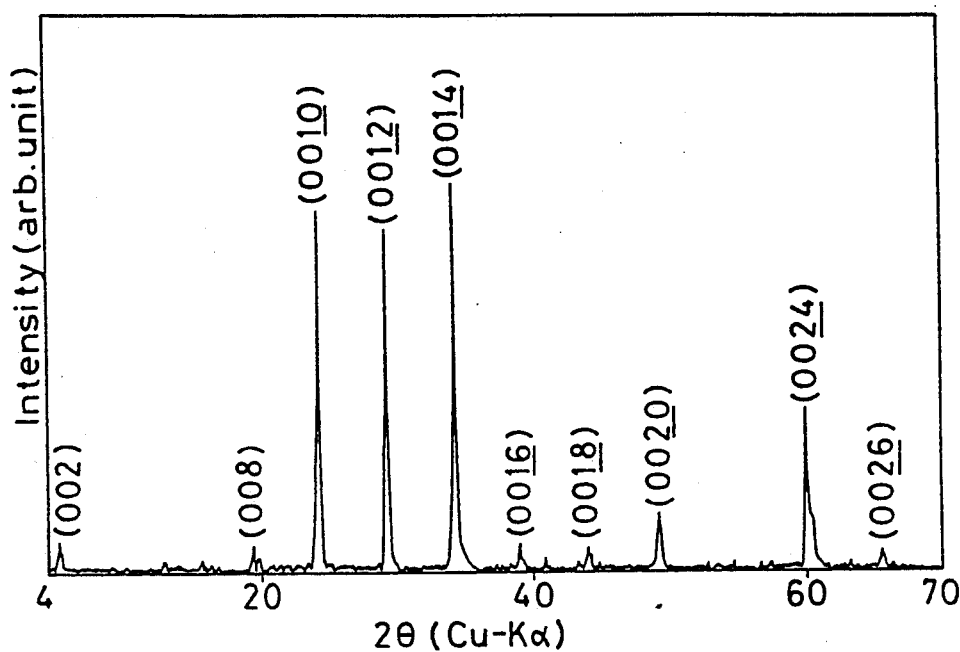
FIG. 5 is a diagram showing one example of an X-ray diffraction pattern of a single crystal of the superconductor prepared according to the present invention.

An X-ray diffraction pattern of the recovered single crystal is shown in FIG. 5. From this X-ray diffraction pattern, it has been confirmed that the single crystal after the heat treatment has a $Bi_2Sr_2Ca_2Cu_3O_{10}$ structure (2223 structure).

Figure 6:
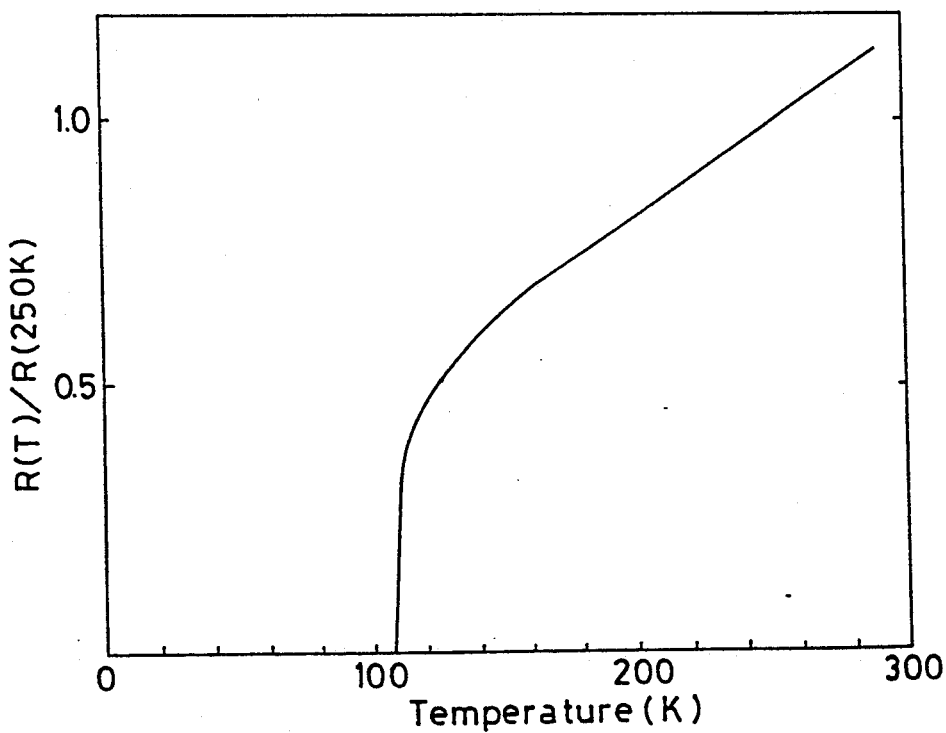
FIG. 6 is a diagram showing the relationship between the absolute temperature and the electrical resistance of a single crystal of the superconductor prepared according to the present invention.

The relationship between the electrical resistance of the fibrous crystal as determined by the d.c. four-terminal method and the absolute temperature was as shown in FIG. 6. The temperture at which the electrical resistance became zero was 103K.

EXAMPLES 8 to 12

In accordance with the procedures described in Example 7, single crystals listed in Table 3 each having a 2212 structure or a 2201 structure were embedded in an oxide powder and heat-treated at a predetermined temperature for 120 hr.

It has been confirmed that each of the fibrous crystals after the heat treatment has the same crystal structure and superconductivity as those of the fibrous crystal in Example 7.

Regarding Examples 7 to 12, the structure of the single crystal before the heat treatment and the composition of the oxide powder are given in Table 3, while the heat-treating temperature, the structure of the single crystal after the heat treatment and the critical temperature are given in Table 4.

TABLE 3

| Ex. No. | Structure of single crystal (starting crystal) before heat treatment | Composition ratio of oxide powder | | | | |
|---|---|---|---|---|---|---|
| | | Bi | Pb | Sr | Ca | Cu |
| 7 | 2212 | 1 | 0.25 | 1 | 2 | 3 |
| 8 | 2212 | 1 | 0.5 | 0.75 | 2.5 | 4 |
| 9 | 2212 | 1 | 1 | 1.5 | 3 | 5 |
| 10 | 2212 | 1 | 0.2 | 1.5 | 3 | 3 |
| 11 | 2212 | 1 | 0.2 | 0.5 | 1 | 1 |
| 12 | 2201 | 1 | 0.25 | 1 | 3 | 3 |

TABLE 4

| Ex. No. | Heat treating Heat treating (°C.) | Structure of single cystal, after heat treatment | Critical temp. (K.) |
|---|---|---|---|
| 7 | 840 | 2223 | 103 |
| 8 | 840 | 2223 | 101 |
| 9 | 830 | 2223 | 104 |
| 10 | 850 | 2223 | 103 |
| 11 | 860 | 2223 | 103 |
| 12 | 840 | 2223 | 102 |

What is claimed is:

1. A process for preparing a superconducting crystal which comprises embedding a starting crystal selected from the group consisting of a fibrous crystal comprising bismuth, strontium, calcium, copper and oxygen and having a $Bi_2Sr_2Ca_1Cu_2O_8$ structure (2212 structure), a fibrous crystal comprising bismuth, strontium, copper and oxygen and having a $Bi_2Sr_2CuO_6$ structure (2201 structure), a single crystal comprising bismuth, strontium, calcium, copper and oxygen and having a $Bi_2Sr_2CaCu_2O_8$ structure (2212 structure), and a single crystal comprising bismuth, strontium, copper and oxygen and having a $Bi_2Sr_2Cu_1O_6$ structure (2201 structure), in an oxide powder having the following atomic composition ratio:

> Bi = 1.0,
> Sr = 0.5 to 1.5,
> Ca = 1.0 to 3.0,
> Cu = 1.0 to 5.0 and
> Pb = 0.2 to 1.0, and heat-treating the embedded starting crystal at 830° to 860° C. to prepare a superconducting crystal having the same crystal form as that of said starting crystal and an atomic composition ratio represented by the formula $Bi_{2-x}Pb_xSr_{1.9-2.1}Ca_{1.9-2.1}Cu_3O_y$ wherein $0 < x < 0.4$ and $10.0 < y < 11.0$ and having only a $Bi_2Sr_2Ca_2Cu_3O_{10}$ structure (2223 structure).

2. A process for preparing a superconducting crystal according to claim 1, wherein the bismuth site of the starting crystal is partially replaced with lead.

* * * * *